(12) United States Patent
Du et al.

(10) Patent No.: US 8,625,989 B2
(45) Date of Patent: Jan. 7, 2014

(54) MULTI-LASER TRANSMITTER OPTICAL SUBASSEMBLIES FOR OPTOELECTRONIC MODULES

(75) Inventors: Tengda Du, San Jose, CA (US); Bernd Huebner, Santa Clara, CA (US)

(73) Assignee: Finisar Corporation, Sunnyvale, CA (US)

( * ) Notice: Subject to any disclaimer, the term of this patent is extended or adjusted under 35 U.S.C. 154(b) by 376 days.

(21) Appl. No.: 13/011,770

(22) Filed: Jan. 21, 2011

(65) Prior Publication Data

US 2012/0189306 A1    Jul. 26, 2012

(51) Int. Cl.
*H04J 14/06* (2006.01)

(52) U.S. Cl.
USPC ............................................. 398/65; 398/43

(58) Field of Classification Search
USPC .......................................................... 398/65
See application file for complete search history.

(56) References Cited

U.S. PATENT DOCUMENTS

| | | | | |
|---|---|---|---|---|
| 4,566,761 A * | 1/1986 | Carlsen et al. | ............ | 359/489.07 |
| 6,134,358 A * | 10/2000 | Wu et al. | ............ | 385/16 |
| 6,208,442 B1 * | 3/2001 | Liu et al. | ............ | 398/9 |
| 6,236,480 B1 * | 5/2001 | Atlas | ............ | 398/9 |
| 6,282,025 B1 | 8/2001 | Huang et al. | | |
| 6,337,934 B1 * | 1/2002 | Wu et al. | ............ | 385/16 |
| 6,552,833 B2 * | 4/2003 | Liu et al. | ............ | 398/82 |
| 7,043,101 B1 | 5/2006 | Huang et al. | | |
| 2003/0133180 A1 * | 7/2003 | Yang et al. | ............ | 359/341.3 |
| 2003/0194237 A1 * | 10/2003 | Farries et al. | ............ | 398/102 |
| 2005/0254022 A1 * | 11/2005 | Kang | ............ | 353/122 |
| 2007/0207670 A1 * | 9/2007 | Stewart et al. | ............ | 439/607 |
| 2010/0322632 A1 | 12/2010 | Way | | |
| 2011/0150477 A1 * | 6/2011 | Winzer | ............ | 398/65 |

FOREIGN PATENT DOCUMENTS

KR    10-2008-0080346    9/2008

OTHER PUBLICATIONS

International Search Report and Written Opinion mailed Aug. 1, 2012 in related International Application No. PCT/US2012/022095.
Xu et al., U.S. Appl. No. 13/011,765, filed Jan. 21, 2011, Multi-Laser Transmitter Optical Subassembly.
Xu et al., U.S. Appl. No. 13/011,741, filed Jan. 21, 2011, Multi-Laser Transmitter Optical Subassembly.

* cited by examiner

*Primary Examiner* — Nathan Curs
*Assistant Examiner* — Tanya Ngo
(74) *Attorney, Agent, or Firm* — Maschoff Brennan

(57) ABSTRACT

Multi-laser transmitter optical subassemblies (TOSAs) for optoelectronic modules. In one example embodiment, a multi-laser TOSA includes first and second lasers configured to generate first and second optical signals, respectively, a polarization beam combiner (PBC), first and second collimating lenses positioned between the first and second lasers, respectively, and the PBC, a half waveplate positioned between the first laser and the PBC, and a focusing lens. The half waveplate is configured to rotate the polarization of the first optical signal. The PBC is configured to combine the first and second optical signals and transmit the combined first and second optical signals toward the focusing lens.

20 Claims, 8 Drawing Sheets

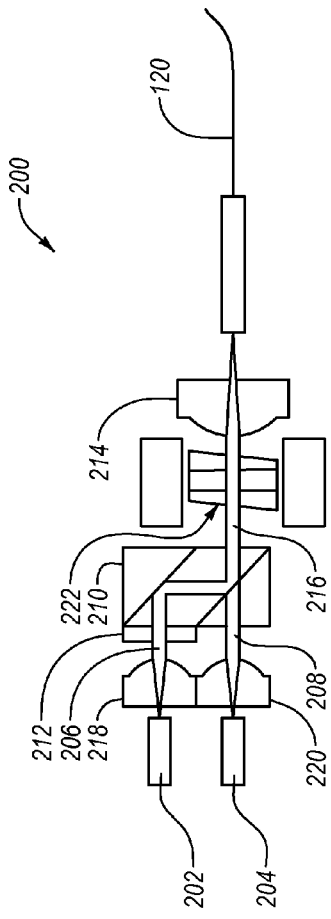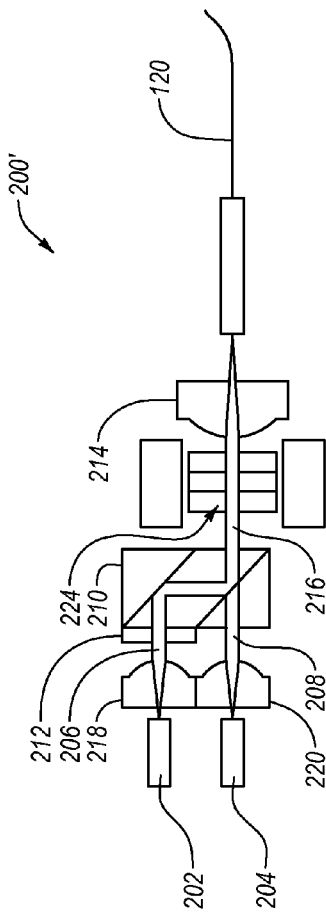

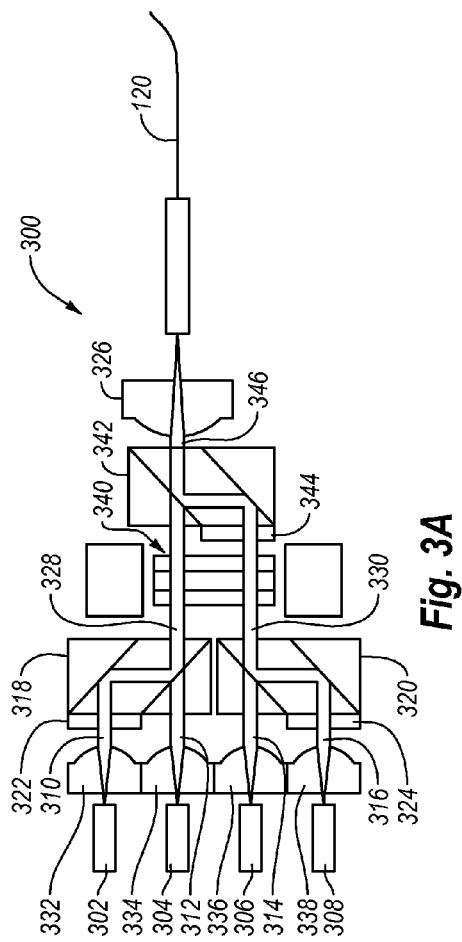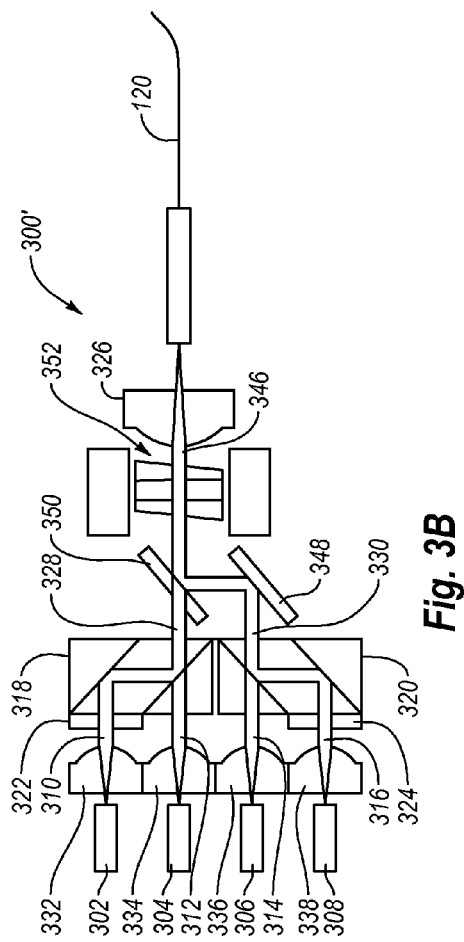

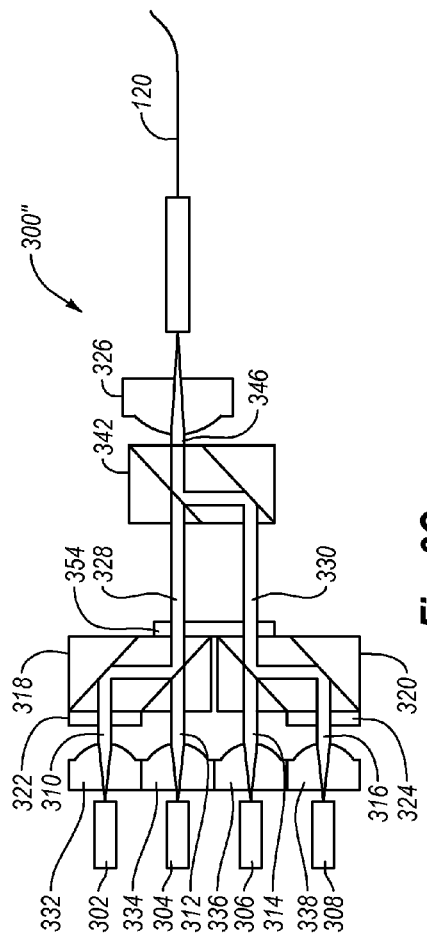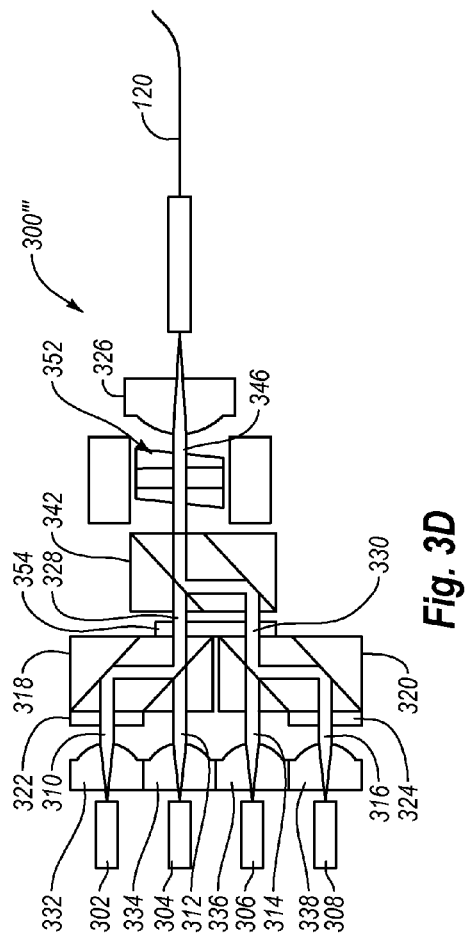

MULTI-LASER TRANSMITTER OPTICAL SUBASSEMBLIES FOR OPTOELECTRONIC MODULES

BACKGROUND

Optoelectronic modules, such as optoelectronic transceiver or transponder modules, are increasingly used in electronic and optoelectronic communication. Some modules can be plugged into a variety of host networking equipment. Modules typically communicate with a printed circuit board of a host device by transmitting electrical signals to the printed circuit board and receiving electrical signals from the printed circuit board. These electrical signals can then be transmitted by the module outside the host device as optical signals.

Multi-source agreements (MSAs), such as the C Form-factor Pluggable (CFP) MSA and the Quad Small Form-factor Pluggable (QSFP) MSA, specify, among other things, housing dimensions for modules. Conformity with an MSA allows a module to be plugged into host equipment designed in compliance with the MSA.

Optical signals are typically generated within a transmitter optical subassembly (TOSA) of a module using a laser, such as a vertical cavity surface emitting laser (VCSEL) or a distributed feedback (DFB) laser. As data rates in modules increase, two or more lasers are often included in a single TOSA. However, as MSAs specify increasingly smaller module housing dimensions, there is less available space for multi-laser TOSAs within the module housing. In addition, multi-laser TOSAs are often relatively expensive and often suffer from relatively high optical loss.

BRIEF SUMMARY OF SOME EXAMPLE EMBODIMENTS

In general, example embodiments of the invention relate to multi-laser transmitter optical subassemblies (TOSAs) for optoelectronic modules. At least some example multi-laser TOSAs disclosed herein exhibit a relatively low size, cost, and optical loss, thus enabling relatively improved overall performance of the optoelectronic modules into which the TOSAs are integrated.

In one example embodiment, a multi-laser TOSA includes first and second lasers configured to generate first and second optical signals, respectively, a polarization beam combiner (PBC), first and second collimating lenses positioned between the first and second lasers, respectively, and the PBC, a half waveplate positioned between the first laser and the PBC, and a focusing lens. The half waveplate is configured to rotate the polarization of the first optical signal. The PBC is configured to combine the first and second optical signals and transmit the combined first and second optical signals toward the focusing lens.

In another example embodiment, an optoelectronic transceiver module includes a printed circuit board, a receiver optical subassembly (ROSA) in electrical communication with the printed circuit board, and a multi-laser TOSA in electrical communication with the printed circuit board. The multi-laser TOSA includes first and second lasers configured to generate first and second optical signals, respectively, a PBC, first and second collimating lenses positioned between the first and second lasers, respectively, and the PBC, a half waveplate positioned between the first laser and the PBC, and a focusing lens. The half waveplate is configured to rotate the polarization of the first optical signal. The PBC is configured to combine the first and second optical signals and transmit the combined first and second optical signals through the isolator toward the focusing lens.

In yet another example embodiment, a multi-laser TOSA includes first, second, third, and fourth lasers configured to generate first, second, third, and fourth optical signals, respectively, a first PBC, first, second, third, and fourth collimating lenses positioned between the first, second, third, and fourth lasers, respectively, and the first PBC, a first half waveplate positioned between the first and second collimating lenses and the first PBC, a focusing lens, and a second PBC positioned between the first PBC and the focusing lens. The first half waveplate is configured to rotate the polarization of the first and second optical signals. The first PBC is configured to combine the first and third optical signals. The first PBC is also configured to combine the second and fourth optical signals. The second half waveplate is configured to rotate the polarization of the combined second and fourth optical signals. The second PBC is configured to combine the combined first and third optical signals and the combined second and fourth optical signals and transmit the combined first, second, third, and fourth optical signals toward the focusing lens.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which:

FIGS. 2A and 2B are schematic views of first and second example multi-laser TOSAs, respectively;

FIGS. 3A, 3B, 3C, and 3D are schematic views of third, fourth, fifth, and sixth example multi-laser TOSAs, respectively;

DETAILED DESCRIPTION OF SOME EXAMPLE EMBODIMENTS

Example embodiments of the present invention relate to multi-laser transmitter optical subassemblies (TOSAs) for optoelectronic modules. At least some example multi-laser TOSAs disclosed herein exhibit a relatively low size, cost, and optical loss, thus enabling relatively improved overall performance of the optoelectronic modules into which the TOSAs are integrated.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1:
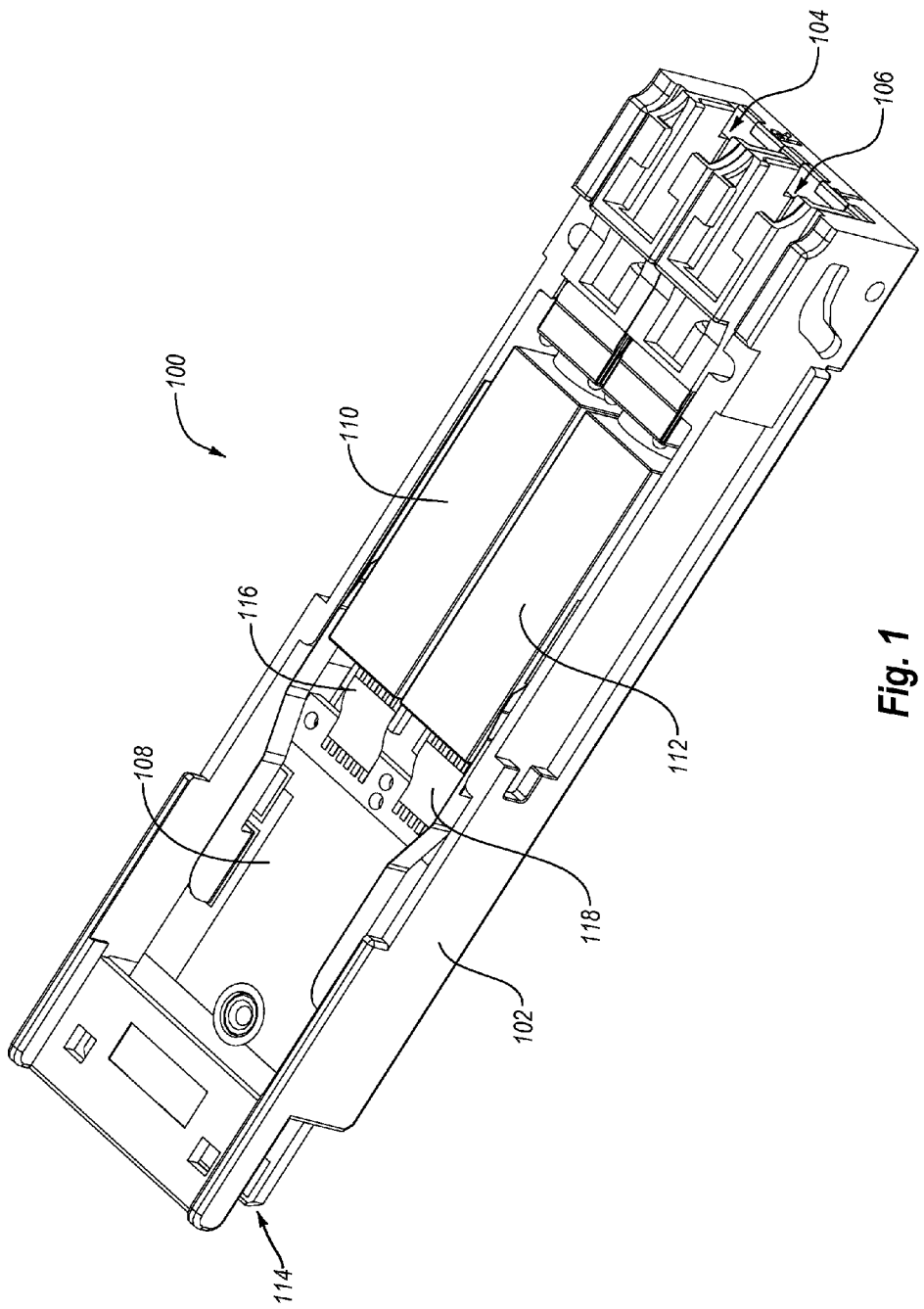
FIG. 1 is a perspective view of an example optoelectronic module and associated transmitter optical subassembly (TOSA)

Reference is first made to FIG. 1 which discloses an example optoelectronic module 100 for use in transmitting and receiving optical signals in connection with a host device (not shown). The module 100 is one environment in which example embodiments of the invention can be practiced. As disclosed in FIG. 1, the module 100 includes various components, including a bottom housing 102 configured to mate with a top housing (not shown), a receive port 104 and a transmit port 106 defined in the bottom housing 102, a printed circuit board (PCB) 108 positioned within the bottom housing 102, a receiver optical subassembly (ROSA) 110, and a TOSA 112. An edge connector 114 is located on an end of the PCB 108 to enable the module 100 to electrically interface with a host device (not shown). As such, the PCB 108 facilitates electrical communication between the ROSA 110/TOSA 112 and the host device.

The module 100 can be configured for optical signal transmission and reception at a variety of data rates including, but not limited to, 40 Gb/s, 100 Gb/s, or higher. Furthermore, the module 100 can be configured for optical signal transmission and reception at various distinct wavelengths using wavelength division multiplexing (WDM) in which multiple optical signals having distinct wavelengths are multiplexed onto a single optical fiber. For example, the module 100 can be configured to operate using one of various WDM schemes, such as Coarse WDM (CWDM), Dense WDM (DWDM), or Light WDM (LWDM). Further, the module 100 can be configured to support various communication protocols including, but not limited to, Fibre Channel and High Speed Ethernet. In addition, although the example module 100 is configured to have a form factor that is substantially compliant with the QSFP MSA, the module 100 can alternatively be configured in a variety of different form factors that are substantially compliant with other MSAs including, but not limited to, the CFP MSA.

With continued reference to FIG. 1, the ROSA 110 houses an optical receiver such as a photodiode (not shown) that is electrically coupled to an electrical interface 116. The TOSA 112 houses multiple optical transmitters such as lasers (not shown) that are electrically coupled to the other electrical interface 118. The optical receiver is configured to convert optical signals received through the receive port 104 into corresponding electrical signals that are relayed to the PCB 108. The optical transmitter is configured to convert electrical signals received through the PCB 108 from a host device (not shown) into corresponding optical signals that are transmitted through the transmit port 106. Accordingly, the ROSA 110 serves as an optical-electronic transducer and the TOSA 112 serves as an electronic-optical transducer. The optical ports 104 and 106 are configured to optically connect the optical receiver and the optical transceiver, respectively, with optical fibers and corresponding optical fiber connectors such as LC or SC connectors (not shown) that are connected to the optical ports.

Having described a specific environment with respect to FIG. 1, it will be understood that this specific environment is only one of countless architectures in which example embodiments of the present invention may be employed. The scope of the present invention is not intended to be limited to any particular environment.

2. First Example Multi-Laser TOSA

With reference now to FIG. 2A, aspects of a first example multi-laser TOSA 200 are disclosed. The TOSA 200 can be employed in a WDM environment in order to increase the data throughput on a single optical fiber 120.

As disclosed in FIG. 2A, the TOSA 200 includes first and second lasers 202 and 204 configured to generate first and second optical signals 206 and 208, respectively. The first and second lasers 202 and 204 may be distributed feedback lasers (DFBs), for example. The first optical signal 206 may have a first distinct wavelength and the second optical signal 208 may have a second distinct wavelength. It is understood, however, that the first and second optical signals 206 and 208 may alternatively have the same wavelength. The TOSA 200 also includes a polarization beam combiner (PBC) 210, a half waveplate 212 positioned between the first laser 202 and the PBC 210, and a focusing lens 214.

Since the first and second lasers 202 and 204 generally have a fixed polarization, during operation of the TOSA 200 the half waveplate 212 is configured to rotate the polarization of the first optical signal 206 to be substantially orthogonal to the polarization of the second optical signal 208. The PBC 210 is then configured to combine the first and second optical signals 206 and 208 and transmit the combined first and second optical signals 216 through the focusing lens 214 and into the optical fiber 120.

As disclosed in FIG. 2A, the TOSA 200 may also include first and second collimating lenses 218 and 220 positioned between the first and second lasers 202 and 204, respectively, and the PBC 210. The TOSA 200 may also include an isolator 222 positioned between the PBC 210 and the focusing lens 214 to reduce or prevent back reflection from reaching either of the lasers 202 or 204. Since the first and second optical signals 206 and 208 in the combined optical signal 216 do not have the same linear polarization state, the isolator 222 may be a polarization insensitive isolator.

3. Second Example Multi-Laser TOSA

With reference now to FIG. 2B, aspects of a second example multi-laser TOSA 200' are disclosed. The TOSA 200' can be employed in a WDM environment in order to increase the data throughput on the optical fiber 120.

As disclosed in FIG. 2B, the TOSA 200' is identical to the TOSA 200 of FIG. 2A, except that the isolator 222 is replaced with an isolator 224. The isolator 224 is a polarizer garnet polarizer (PGP) isolator. In at least some example embodiments, the first polarizer (P) of the PGP isolator is configured such that the polarization axis is about 45 degrees off of the horizontal or vertical plane resulting in each channel having an inherently balanced about 3 dB loss. Although the isolator 224 is generally less expensive than the isolator 222, the isolator 222 generally exhibits lower levels of optical loss.

4. Third Example Multi-Laser TOSA

With reference now to FIG. 3A, aspects of a third example multi-laser TOSA 300 are disclosed. The TOSA 300 can be employed in a WDM environment in order to increase the data throughput on the optical fiber 120.

As disclosed in FIG. 3A, the TOSA 300 includes first, second, third, and fourth lasers 302-308 configured to generate first, second, third, and fourth optical signals 310-316, respectively. The optical signals 310-316 may have first, second, third, and fourth distinct wavelengths, respectively.

Alternatively, one or more of the optical signals 310-316 may have the same wavelength. The TOSA 300 also includes first and second PBCs 318 and 320, first and second half waveplate 322 and 324, and a focusing lens 326. The first half waveplate 322 is positioned between the first laser 302 and the PBC 318. The second half waveplate 324 is positioned between the fourth laser 308 and the PBC 320.

As the lasers 302-308 generally have a fixed polarization, during operation of the TOSA 300 the half waveplates 322 and 324 are configured to rotate the polarizations of the first and fourth optical signals 310 and 316 to be substantially orthogonal to the polarizations of the second and third optical signals 312 and 314. The PBC 318 is then configured to combine the first and second optical signals 310 and 312 and transmit the combined first and second optical signals 328 toward the focusing lens 326. Simultaneously, the PBC 320 is then configured to combine the third and fourth optical signals 314 and 316 and transmit the combined third and fourth optical signals 330 toward the focusing lens 326.

As disclosed in FIG. 3A, the TOSA 300 may also include first and second collimating lenses 332 and 334 positioned between the lasers 302 and 304, respectively, and the PBC 318, as well as third and fourth collimating lenses 336 and 338 positioned between the lasers 306 and 308, respectively, and the PBC 320. The TOSA 300 may also include an isolator 340 positioned between the PBCs 318 and 320 and the focusing lens 326 to reduce or prevent back reflection from reaching any of the lasers 302-308. The isolator 340 is a PGP isolator.

As disclosed in FIG. 3A, the TOSA 300 may also include a third PBC 342 positioned between the isolator 340 and the focusing lens 326, as well as a third half waveplate 344 positioned between the isolator 340 and the third PBC 342. During operation of the TOSA 300, the third half waveplate 344 is configured to rotate the polarization of the combined third and fourth optical signals 330, and the third PBC 342 is configured to combine the combined first and second optical signals 328 and the combined third and fourth optical signals 330 and transmit the combined first, second, third, and fourth optical signals 346 through the focusing lens 326 and into the optical fiber 120.

5. Fourth Example Multi-Laser TOSA

With reference now to FIG. 3B, aspects of a fourth example multi-laser TOSA 300' are disclosed. The TOSA 300' can be employed in a WDM environment in order to increase the data throughput on the optical fiber 120.

As disclosed in FIG. 3B, the TOSA 300' is identical to the TOSA 300 of FIG. 3A, except that the third PBC 342 is omitted, a minor 348 and a filter 350 are added, and the isolator 340 is replaced with an isolator 352. The isolator 352 is a polarization insensitive isolator. In addition, another difference from the TOSA 300 of FIG. 3A is that the optical signals 310-316 of the TOSA 300' of FIG. 3B may have first, second, third, and fourth distinct wavelengths, respectively, or, alternatively, the optical signals 310 and 312 may have a first distinct wavelength and the optical signals 314 and 316 may have a second distinct wavelength.

During operation of the TOSA 300', the mirror 348 is configured to reflect the combined third and fourth optical signals 330 toward the filter 350, the filter 350 is configured to both transmit the combined first and second optical signals 328 and reflect the combined third and fourth optical signals 330 such that the combined first, second, third, and fourth optical signals 346 can pass through the isolator 352, through the focusing lens 326, and into the optical fiber 120.

6. Fifth Example Multi-Laser TOSA

With reference now to FIG. 3C, aspects of a fifth example multi-laser TOSA 300" are disclosed. The TOSA 300" can be employed in a WDM environment in order to increase the data throughput on the optical fiber 120.

As disclosed in FIG. 3C, the TOSA 300" is identical to the TOSA 300 of FIG. 3A, except that the isolator 340 and the half waveplate 344 are removed and an optical component 354 is added. The optical component 354 can be a polarizer with an about 45 degree polarization axis. Alternatively, the optical component 354 can be a half waveplate with an optical axis that is oriented about 22.5 degrees or about 67.5 degrees relative to the horizontal or vertical plane.

7. Sixth Example Multi-Laser TOSA

With reference now to FIG. 3D, aspects of a sixth example multi-laser TOSA 300''' are disclosed. The TOSA 300''' can be employed in a WDM environment in order to increase the data throughput on the optical fiber 120.

As disclosed in FIG. 3D, the TOSA 300''' is identical to the TOSA 300" of FIG. 3C, except that the isolator 352 has been added between the third PBC 342 and the focusing lens 326.

8. Seventh Example Multi-Laser TOSA

Figure 4A:
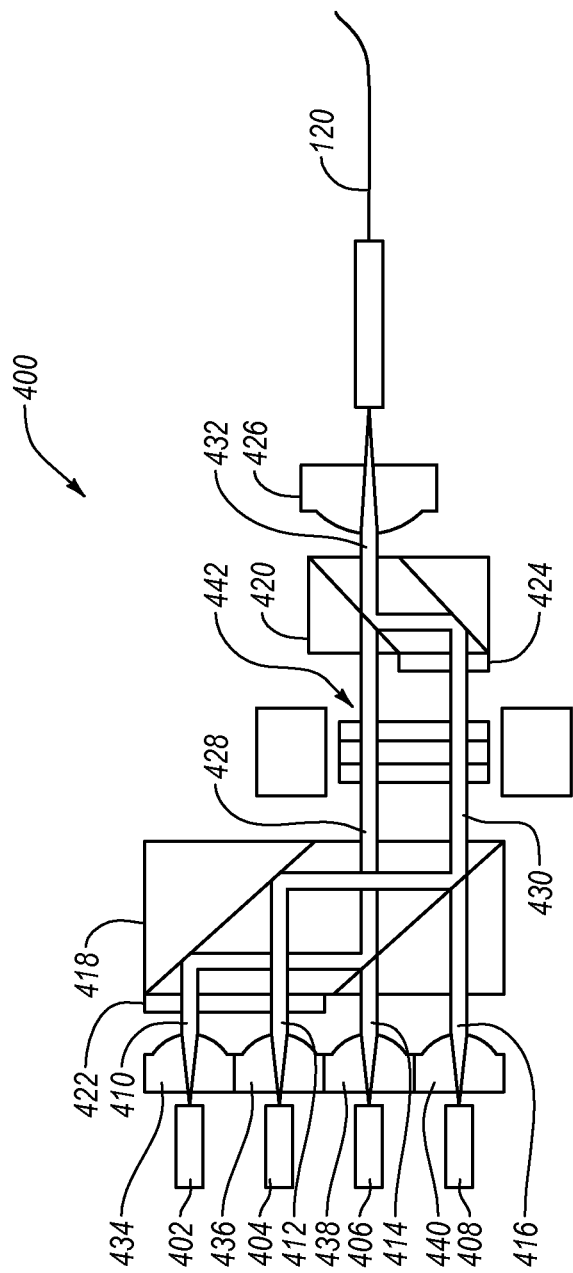
FIGS. 4A, 4B, and 4C is a schematic view of seventh, eighth, and ninth example multi-laser TOSAs, respectively.

With reference now to FIG. 4A, aspects of a seventh example multi-laser TOSA 400 are disclosed. The TOSA 400 can be employed in a WDM environment in order to increase the data throughput on the optical fiber 120.

As disclosed in FIG. 4A, the TOSA 400 includes first, second, third, and fourth lasers 402-408 configured to generate first, second, third, and fourth optical signals 410-416, respectively. The optical signals 410-416 may have first, second, third, and fourth distinct wavelengths, respectively. Alternatively, one or more of the optical signals 410-416 may have the same wavelength. The TOSA 400 also includes first and second PBCs 418 and 420, first and second half waveplates 422 and 424, and a focusing lens 426. The first half waveplate 422 is positioned between the first and second lasers 402 and 404 and the PBC 418. The second half waveplate 424 is positioned between the first and second PBCs 418 and 420.

As the lasers 402-408 generally have a fixed polarization, during operation of the TOSA 400 the half waveplate 422 is configured to rotate the polarizations of the first and second optical signals 410 and 412 to be substantially orthogonal to the polarizations of the third and fourth optical signals 414 and 416. The PBC 418 is then configured to combine the first and third optical signals 410 and 414 and transmit the combined first and third optical signals 428 toward the second PBC 420. Simultaneously, the PBC 418 is also configured to combine the second and fourth optical signals 412 and 416 and transmit the combined second and fourth optical signals 430 toward the second PBC 420. The half waveplate 424 is next configured to rotate the polarizations of the combined second and fourth optical signals 430. The PBC 420 is then configured to combine the combined first and third optical signals 428 and the combined second and fourth optical signal 430 and transmit the combined first, second, third, and fourth optical signals 432 through the focusing lens 426 and into an optical fiber 120.

As disclosed in FIG. 4A, the TOSA 400 may also include first, second, third, and fourth collimating lenses 434-440 positioned between the lasers 402-408, respectively, and the PBC 418. The TOSA 400 may also include an isolator 442 positioned between the PBCs 418 and 420 and the focusing lens 426 to reduce or prevent back reflection from reaching any of the lasers 402-408. The isolator 442 is a PGP isolator.

9. Eighth Example Multi-Laser TOSA

Figure 4B:
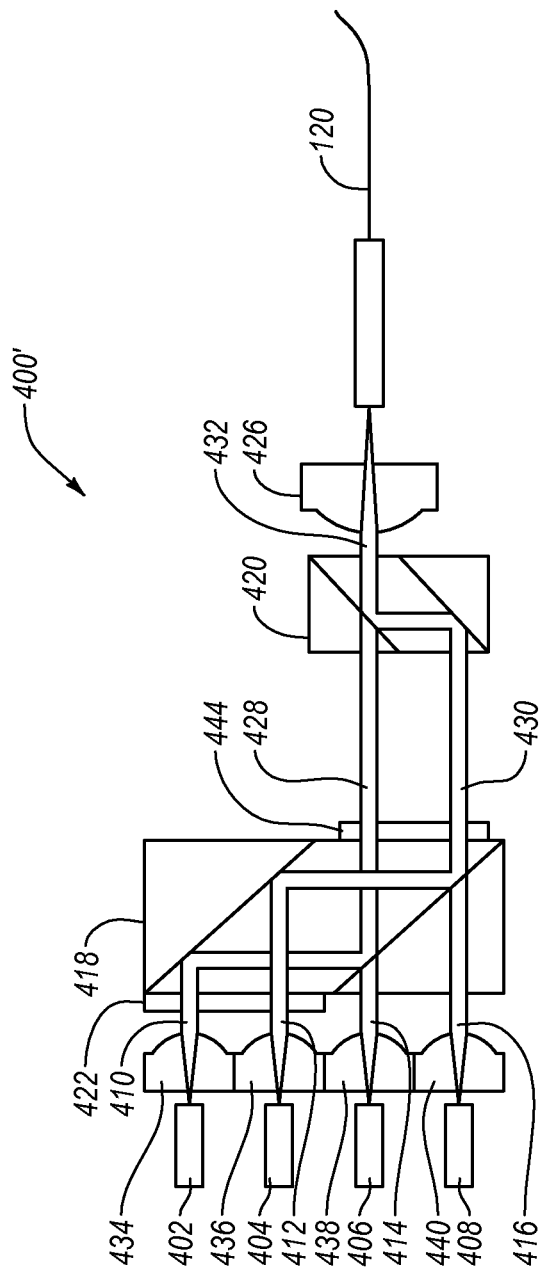

With reference now to FIG. 4B, aspects of an eighth example multi-laser TOSA 400' are disclosed. The TOSA 400' can be employed in a WDM environment in order to increase the data throughput on the optical fiber 120.

As disclosed in FIG. 4B, the TOSA 400' is identical to the TOSA 400 of FIG. 4A, except that the isolator 442 and the half waveplate 424 are removed and an optical component 444 is added. The optical component 444 can be a polarizer with an about 45 degree polarization axis. Alternatively, the optical component 444 can be a half waveplate with an optical axis that is oriented about 22.5 degrees or about 67.5 degrees relative to the horizontal or vertical plane.

10. Ninth Example Multi-Laser TOSA

Figure 4C:
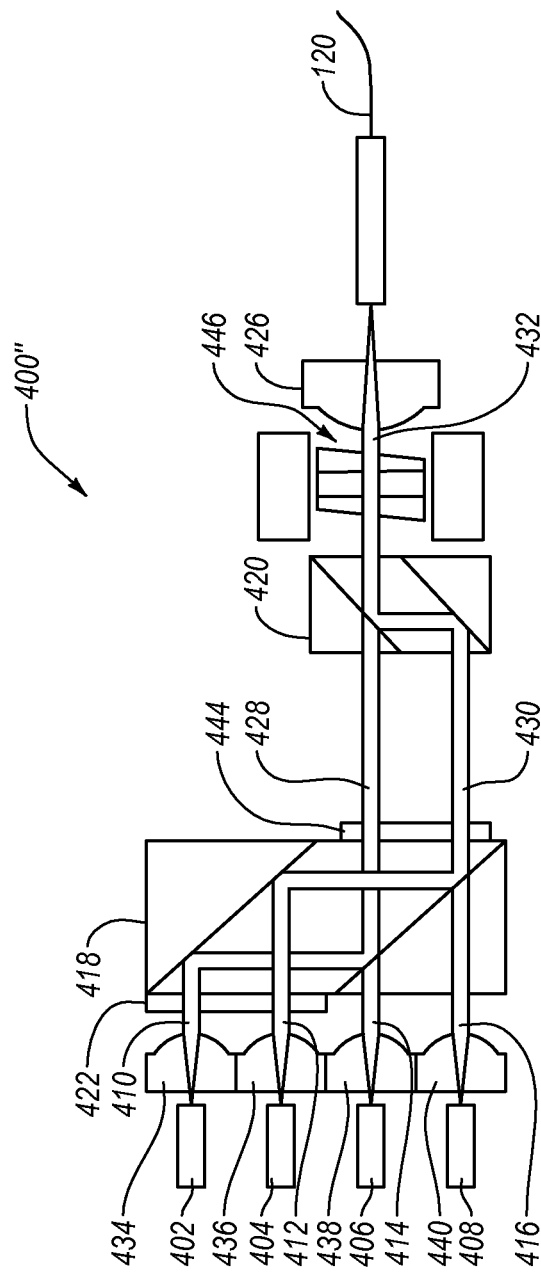

With reference now to FIG. 4C, aspects of a ninth example multi-laser TOSA 400" are disclosed. The TOSA 400" can be employed in a WDM environment in order to increase the data throughput on the optical fiber 120.

As disclosed in FIG. 4C, the TOSA 400" is identical to the TOSA 400' of FIG. 3C, except that an isolator 446 has been added between the second PBC 420 and the focusing lens 426. The isolator 446 is a polarization insensitive isolator.

11. Tenth Example Multi-Laser TOSA

Figure 5:
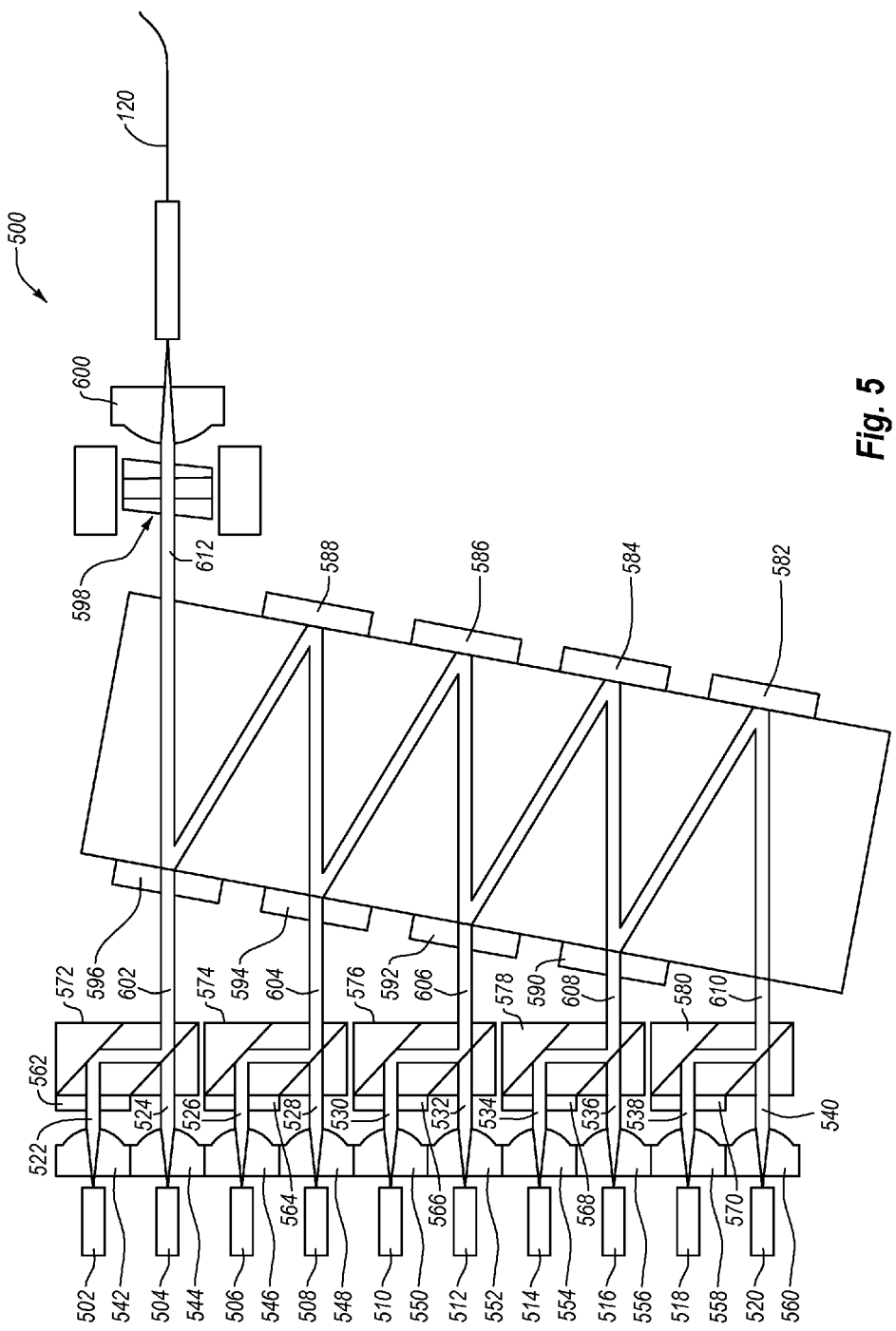
FIG. 5 is a schematic view of a tenth example multi-laser TOSA.

With reference now to FIG. 5, aspects of a tenth example multi-laser TOSA 500 are disclosed. The TOSA 500 can be employed in a WDM environment in order to increase the data throughput on the optical fiber 120.

As disclosed in FIG. 5, the TOSA 500 also includes N lasers 502-520 configured to generate N optical signals 522-540, respectively. The TOSA 500 also includes N collimating lenses 542-560, N/2 half waveplates 562-570, N/2 PBCs 572-580, (N−1)/2 mirrors 582-588, (N−1)/2 filters 590-596, an isolator 598, and a focusing lens 600. The N optical signals 522-540 may have N distinct wavelengths, respectively. Alternatively, any two of the N optical signals 522-540 that share the same PBC may have the same wavelength. For example, optical signals 522 and 524 may have a first distinct wavelength, optical signals 526 and 528 may have a second distinct wavelength, optical signal 530 and 532 may have a third distinct wavelength, and so forth.

The half waveplates 562-570 are positioned between the odd-positioned additional lasers (namely, the first lasers 502, the third laser 506, the fifth laser 510, the seventh laser 514, and the ninth laser 518) and the PBCs 572-80, respectively. Since the lasers 502-520 generally have a fixed polarization, during operation of the TOSA 500 the half waveplates 562-570 are configured to rotate the polarizations of the optical signals 522, 526, 530, 534, and 538 to be substantially orthogonal to the polarizations of the optical signals 524, 528, 532, 536, and 540, respectively. The PBCs 572-580 are then configured to combine the optical signals 522 and 524, 526 and 528, 530 and 532, 534 and 536, and 538 and 540, respectively. The mirrors 582-588 and the filters 590-596 then cooperate to combine the combined optical signals 602-610 into a combined optical signal 612 that includes all of the optical signals 522-540. The combined optical signal 612 then passed through the isolator 598, which is a polarization insensitive isolator, through the focusing lens 600, and into the optical fiber 120.

Although the number N of lasers in the tenth example multi-laser TOSA 500 is equal to ten, it is understood that the TOSA 500 could be modified to have less than ten lasers or greater than ten lasers. Further, the relative numbers of collimating lenses, half waveplates, PBCs, mirrors, and filters are generally accurate where N is an even integer that is greater than or equal to two. It is understood, however, that the TOSA 500 may alternatively include an odd number of lasers.

The use of PBCs in each of the example multi-laser TOSAs disclosed herein enables the combination of multiple optical signals with relatively low optical loss. The size and cost of the example multi-laser TOSAs disclosed herein are also relatively low compared to prior art multi-laser TOSAs. One reason for the relatively low size and cost of the example multi-laser TOSAs disclosed herein is that fewer and generally less expensive components are used in the example multi-laser TOSAs disclosed herein. For example, many prior art multi-laser TOSAs require N−1 filters and N−1 mirrors, where N is the number of lasers in the TOSA. However, in the example multi-laser TOSAs disclosed herein, the use of the PBCs completely eliminates the need for filters and mirrors in the example multi-laser TOSAs 200, 200', 300, 300", 300"', 400, 400', and 400" and reduces the need by half for filters and mirrors in the example multi-laser TOSAs 300' and 500.

The use of PBCs in each of the example multi-laser TOSAs disclosed herein thus enables the example multi-laser TOSAs disclosed herein to exhibit a relatively low size, cost, and optical loss. Consequently, optoelectronic modules into which the TOSAs are integrated also exhibit relatively improved overall performance.

The example embodiments disclosed herein may be embodied in other specific forms. The example embodiments disclosed herein are to be considered in all respects only as illustrative and not restrictive.

What is claimed is:

1. A multi-laser transmitter optical subassembly (TOSA) comprising:

first and second lasers configured to generate first and second optical signals, respectively;

a first polarization beam combiner (PBC);

first and second collimating lenses positioned between the first and second lasers, respectively, and the first PBC;

a first half waveplate positioned between the first laser and the first PBC;

a focusing lens;

third and fourth lasers configured to generate third and fourth optical signals, respectively;

a second PBC positioned between the third and fourth lasers and the focusing lens;

third and fourth collimating lenses positioned between the third and fourth lasers, respectively, and the second PBC;

a second half waveplate positioned between the fourth collimating lens and the second PBC;

a third PBC positioned between the first and second PBCs and the focusing lens;

an isolator positioned between the first and second PBCs and the third PBC, the isolator comprising a polarizer garnet polarizer (PGP) isolator with a polarization axis that is about 45 degrees off of the horizontal or vertical plane; and a third half waveplate positioned between the isolator and the third PBC, wherein the first half waveplate is configured to rotate the polarization of the first optical signal, the first PBC is configured to combine the first and second optical signals and transmit the combined first and second optical signals toward the focusing lens, the second half waveplate is configured to rotate the polarization of the fourth optical signal, the second PBC is configured to combine the third and fourth optical signals and transmit the combined third and fourth optical signals, the third half waveplate is configured to rotate the polarization of the combined third and fourth optical signals, and the third PBC is configured to combine the combined first and second optical signals and the combined third and fourth optical signals and transmit the combined first, second, third, and fourth optical signals toward the focusing lens.

2. The multi-laser TOSA as recited in claim 1, further comprising:
a polarization insensitive isolator positioned between the first and second PBCs and the focusing lens;
a mirror; and
a filter,
wherein the mirror is configured to reflect the combined third and fourth optical signals toward the filter, the filter is configured to both transmit the combined first and second optical signals and reflect the combined third and fourth optical signals such that the combined first, second, third, and fourth optical signals can pass through the isolator to the focusing lens.

3. The multi-laser TOSA as recited in claim 2, further comprising:
N additional lasers configured to generate N additional optical signals, respectively;
N/2 additional PBCs;
N/2 additional half waveplates positioned between the odd-positioned additional lasers and the additional PBCs, respectively;
N/2 additional mirrors;
N/2 additional filters,
wherein N is an even number that is greater than or equal to two, and the multi-laser TOSA is configured to pass the first, second, third, and fourth optical signals combined with the N additional optical signals through the isolator to the focusing lens.

4. The multi-laser TOSA as recited in claim 1, wherein each of the first, second, third, and fourth optical signals has a distinct wavelength.

5. A multi-laser transmitter optical subassembly (TOSA) comprising:
first and second lasers configured to generate first and second optical signals, respectively;
a first polarization beam combiner (PBC);
first and second collimating lenses positioned between the first and second lasers, respectively, and the first PBC;
a first half waveplate positioned between the first laser and the first PBC;
a focusing lens;
third and fourth lasers configured to generate third and fourth optical signals, respectively;
a second PBC positioned between the third and fourth lasers and the focusing lens;
third and fourth collimating lenses positioned between the third and fourth lasers, respectively, and the second PBC;
a second half waveplate positioned between the fourth collimating lens and the second PBC;
a third PBC positioned between the first and second PBCs and the focusing lens; and
an optical component positioned between the first and second PBCs and the third PBC, the optical component comprising either a polarizer with an about 45 degree polarization axis or a half waveplate with an optical axis that is oriented about 22.5 degrees or about 67.5 degrees relative to a horizontal plane or vertical plane,
wherein the first half waveplate is configured to rotate the polarization of the first optical signal, the first PBC is configured to combine the first and second optical signals and transmit the combined first and second optical signals toward the focusing lens, the second half waveplate is configured to rotate the polarization of the fourth optical signal, the second PBC is configured to combine the third and fourth optical signals and transmit the combined third and fourth optical signals, the combined first and second optical signals and the combined third and fourth optical signals are configured to pass through the optical component, and the third PBC is configured to combine the combined first and second optical signals and the combined third and fourth optical signals and transmit the combined first, second, third, and fourth optical signals toward the focusing lens.

6. The multi-laser TOSA as recited in claim 5, further comprising a polarization insensitive isolator positioned between the third PBC and the focusing lens.

7. The multi-laser TOSA as recited in claim 5, wherein each of the first, second, third, and fourth optical signals has a distinct wavelength.

8. An optoelectronic transceiver module comprising:
a printed circuit board;
a receiver optical subassembly (ROSA) in electrical communication with the printed circuit board; and
a multi-laser TOSA in electrical communication with the printed circuit board, the multi-laser TOSA comprising:
first and second lasers configured to generate first and second optical signals, respectively;
a first PBC;
first and second collimating lenses positioned between the first and second lasers, respectively, and the first PBC;
a first half waveplate positioned between the first laser and the first PBC;
a focusing lens;
third and fourth lasers configured to generate third and fourth optical signals, respectively;
a second PBC positioned between the third and fourth lasers and the focusing lens;
third and fourth collimating lenses positioned between the third and fourth lasers, respectively, and the second PBC;
a second half waveplate positioned between the fourth collimating lens and the second PBC;
a third PBC positioned between the first and second PBCs and the focusing lens; and
an isolator positioned between the first and second PBCs and the third PBC, the isolator comprising a polarizer garnet polarizer (PGP) isolator with a polarization axis that is about 45 degrees off of the horizontal or vertical plane; and
a third half waveplate positioned between the isolator and the third PBC,
wherein the first half waveplate is configured to rotate the polarization of the first optical signal, the first PBC is configured to combine the first and second optical signals and transmit the combined first and second optical signals through the isolator toward the focusing lens, the second half waveplate is configured to rotate the polarization of the fourth optical signal, the second PBC is configured to combine the third and fourth optical signals and transmit the combined third and fourth optical signals, the third half waveplate is configured to rotate the polarization of the combined third and fourth optical signals, and the third PBC is configured to combine the combined first and second optical signals and the combined third and fourth optical signals and transmit the combined first, second, third, and fourth optical signals toward the focusing lens.

9. The optoelectronic transceiver module as recited in claim 8, wherein the multi-laser TOSA further comprises:
- a polarization insensitive isolator positioned between the first and second PBCs and the focusing lens;
- a mirror; and
- a filter,
- wherein the minor is configured to reflect the combined third and fourth optical signals toward the filter, the filter is configured to both transmit the combined first and second optical signals and reflect the combined third and fourth optical signals such that the first, second, third, and fourth optical signals can pass through the isolator to the focusing lens.

10. The optoelectronic transceiver module as recited in claim 9, wherein the multi-laser TOSA further comprises:
- N additional lasers configured to generate N additional optical signals, respectively;
- N/2 additional PBCs;
- N/2 additional half waveplates positioned between the odd-positioned additional lasers and the additional PBCs, respectively;
- N/2 additional minors;
- N/2 additional filters,
- wherein N is an even number that is greater than or equal to two, and the multi-laser TOSA is configured to pass the first, second, third, and fourth optical signals combined with the N additional optical signals through the isolator to the focusing lens.

11. The optoelectronic transceiver module as recited in claim 8, wherein each of the first, second, third, and fourth optical signals has a distinct wavelength.

12. The optoelectronic transceiver module as recited in claim 8, wherein the first and second optical signals have a first distinct wavelength and the third and fourth optical signals have a second distinct wavelength.

13. An optoelectronic transceiver module comprising:
- a printed circuit board;
- a ROSA in electrical communication with the printed circuit board; and
- a multi-laser TOSA in electrical communication with the printed circuit board, the multi-laser TOSA comprising:
    - first and second lasers configured to generate first and second optical signals, respectively;
    - a first PBC;
    - first and second collimating lenses positioned between the first and second lasers, respectively, and the first PBC;
    - a first half waveplate positioned between the first laser and the first PBC;
    - a focusing lens;
    - third and fourth lasers configured to generate third and fourth optical signals, respectively;
    - a second PBC positioned between the third and fourth lasers and the focusing lens;
    - third and fourth collimating lenses positioned between the third and fourth lasers, respectively, and the second PBC;
    - a second half waveplate positioned between the fourth collimating lens and the second PBC;
    - a third PBC positioned between the first and second PBCs and the focusing lens; and
    - an optical component positioned between the first and second PBCs and the third PBC, the optical component comprising either a polarizer with an about 45 degree polarization axis or a half waveplate with an optical axis that is oriented about 22.5 degrees or about 67.5 degrees relative to a horizontal plane or vertical plane,
    - wherein the first half waveplate is configured to rotate the polarization of the first optical signal, the first PBC is configured to combine the first and second optical signals and transmit the combined first and second optical signals through the isolator toward the focusing lens, the second half waveplate is configured to rotate the polarization of the fourth optical signal, the second PBC is configured to combine the third and fourth optical signals and transmit the combined third and fourth optical signals, the combined first and second optical signals and the combined third and fourth optical signals are configured to pass through the optical component, and the third PBC is configured to combine the combined first and second optical signals and the combined third and fourth optical signals and transmit the combined first, second, third, and fourth optical signals toward the focusing lens.

14. The optoelectronic transceiver module as recited in claim 13, wherein the multi-laser TOSA further comprises a polarization insensitive isolator positioned between the third PBC and the focusing lens.

15. The optoelectronic transceiver module as recited in claim 13, wherein each of the first, second, third, and fourth optical signals has a distinct wavelength.

16. A multi-laser TOSA comprising:
- first, second, third, and fourth lasers configured to generate first, second, third, and fourth optical signals, respectively;
- a first PBC;
- first, second, third, and fourth collimating lenses positioned between the first, second, third, and fourth lasers, respectively, and the first PBC;
- a first half waveplate positioned between the first and second collimating lenses and the first PBC;
- a focusing lens; and
- a second PBC positioned between the first PBC and the focusing lens,
- wherein the first half waveplate is configured to rotate the polarization of the first and second optical signals, the first PBC is configured to combine the first and third optical signals, the first PBC is configured to combine the second and fourth optical signals, and the second PBC is configured to combine the combined first and third optical signals and the combined second and fourth optical signals and transmit the combined first, second, third, and fourth optical signals toward the focusing lens.

17. The multi-laser TOSA as recited in claim 16, further comprising:
- an isolator positioned between the first and second PBCs, the isolator comprising a PGP isolator with a polarization axis that is about 45 degrees off of the horizontal or vertical plane; and
- a second half waveplate positioned between the isolator and the second PBC, the second half waveplate configured to rotate the polarization of the combined second and fourth optical signals.

18. The multi-laser TOSA as recited in claim 16, further comprising an optical component positioned between the first and second PBCs, the optical component comprising either a polarizer with an about 45 degree polarization axis or a half waveplate with an optical axis that is oriented about 22.5 degrees or about 67.5 degrees relative to a horizontal plane or vertical plane, wherein the combined first and second optical signals and the combined third and fourth optical signals are configured to pass through the optical component.

19. The multi-laser TOSA as recited in claim 18, further comprising a polarization insensitive isolator positioned between the second PBC and the focusing lens.

20. An optoelectronic transceiver module comprising:
a printed circuit board;
a ROSA in electrical communication with the printed circuit board; and
the multi-laser TOSA as recited in claim 16 in electrical communication with the printed circuit board.

* * * * *